United States Patent
Hou et al.

(10) Patent No.: US 9,715,931 B2
(45) Date of Patent: Jul. 25, 2017

(54) RESISTIVE MEMORY APPARATUS AND A WRITING METHOD THEREOF

(71) Applicant: Winbond Electronics Corp., Taichung (TW)

(72) Inventors: Tuo-Hung Hou, Taichung (TW); I-Ting Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/016,244

(22) Filed: Feb. 4, 2016

(65) Prior Publication Data
US 2017/0125098 A1    May 4, 2017

(30) Foreign Application Priority Data
Oct. 30, 2015    (CN) .......................... 2015 1 0724197

(51) Int. Cl.
*G11C 11/16*      (2006.01)
*G11C 13/00*      (2006.01)

(52) U.S. Cl.
CPC ...... *G11C 13/0097* (2013.01); *G11C 13/0069* (2013.01)

(58) Field of Classification Search
CPC ............................. G11C 13/0069; G11C 11/16
USPC .................................................. 365/148, 158
See application file for complete search history.

(56) References Cited

U.S. PATENT DOCUMENTS

| | | | |
|---|---|---|---|
| 7,382,647 B1 * | 6/2008 | Gopalakrishnan ...... G11C 11/16 365/100 |
| 8,077,505 B2 * | 12/2011 | Chen .................... G11C 11/5678 365/148 |
| 2008/0273378 A1 | 11/2008 | Philipp et al. |
| 2009/0279343 A1 * | 11/2009 | Chang .................. C07D 413/14 365/148 |
| 2012/0188813 A1 * | 7/2012 | Chien ................... G11C 7/1045 365/148 |
| 2012/0211719 A1 * | 8/2012 | Haimoto ............... H01L 45/085 257/4 |
| 2012/0250403 A1 | 10/2012 | Wang et al. |

(Continued)

OTHER PUBLICATIONS

S. Park., et al., "Neuromorphic Speech Systems using Advanced ReRAM-based Synapse," 2013 IEEE International Electron Devices Meeting (IEDM), Dec. 9-11, 2013, pp. 25.6.1-25.6.4.

(Continued)

*Primary Examiner* — Michael Tran
(74) *Attorney, Agent, or Firm* — Jianq Chyun IP Office (57) ABSTRACT

A resistive memory apparatus including a resistive memory cell array and a control unit is provided. The resistive memory cell array includes resistive memory cells. The control unit is configured to receive a logic data, determine a logic level of the logic data, and select one resistive memory cell from the resistive memory cells. The control unit provides a set signal or a reset signal to the selected resistive memory cell in a writing period according to the logic level of the logic data. The set signal includes a first set pulse and a second set pulse having a polarity opposite to that of the first set pulse. The reset signal includes a first reset pulse and a second reset pulse having a polarity opposite to that of the first reset pulse. A writing method of the resistive memory apparatus is also provided.

6 Claims, 8 Drawing Sheets

(56) References Cited

U.S. PATENT DOCUMENTS

| | | | |
|---|---|---|---|
| 2013/0294136 A1* | 11/2013 | Siau | G11C 7/04 |
| | | | 365/66 |
| 2013/0301337 A1 | 11/2013 | Kamalanathan et al. | |
| 2014/0112052 A1* | 4/2014 | Strand | G11C 29/08 |
| | | | 365/148 |
| 2015/0194212 A1* | 7/2015 | Faraoni | G11C 13/0064 |
| | | | 365/148 |
| 2015/0380086 A1* | 12/2015 | Park | G11C 13/0069 |
| | | | 365/148 |
| 2016/0034350 A1* | 2/2016 | DeBrosse | G11C 11/4076 |
| | | | 714/764 |
| 2016/0322368 A1* | 11/2016 | Sun | H01L 29/78391 |
| 2017/0004868 A1* | 1/2017 | Ghosh | G11C 11/1673 |

OTHER PUBLICATIONS

"Office Action of Taiwan Counterpart Application", issued on Oct. 12, 2016, p. 1-p. 5, in which the listed references were cited.

* cited by examiner

RESISTIVE MEMORY APPARATUS AND A WRITING METHOD THEREOF

CROSS-REFERENCE TO RELATED APPLICATION

This application claims the priority benefit of China application serial no. 201510724197.8, filed on Oct. 30, 2015. The entirety of the above-mentioned patent application is hereby incorporated by reference herein and made a part of this specification.

BACKGROUND

Field of the Invention

The invention is directed to a memory apparatus and a writing method thereof, and more particularly, to a resistive memory apparatus and a writing method thereof.

Description of Related Art

A non-volatile memory has an advantage that data stored therein is not disappeared after being power off, so that it serves as a necessary memory element for maintaining a normal operation of many electronic products. Presently, a resistive random access memory (RRAM) is a kind of non-volatile memory positively developed in the industry, which has advantages of low write operation voltage, short write and erase time, long memory time, non-destructive reading, multi-state memory, simple structure and small occupation area, etc., and has a great application potential in personal computers and electronic equipment in the future.

Generally, a control unit of a resistive memory apparatus determines whether to provide a set pulse or a reset pulse to a memory cell according to a logic level of a data when the data is written into the memory cell. However, in an example among the currently available techniques, a set pulse or a reset pulse having the same width and amplitude is provided. However, this writing manner causes the control unit to mistakenly determine a writing state of the memory cell when the memory cell is being read. Additionally, in another example among the currently available techniques, a set pulse or a reset pulse having the same amplitude but a gradually increased width is provided to the memory cell. However, this writing manner results in the increase of complexity of designing the control unit of the resistive memory apparatus, which leads to additionally increased manufacturing cost.

SUMMARY

The invention provides a resistive memory apparatus and a writing method thereof which increases the accuracy of determining a state of a memory cell when the memory cell is read.

According to an embodiment, the writing method includes receiving a logic data, determining a logic level of the logic data and selecting a resistive memory cell; and providing a set signal or a reset signal to the resistive memory cell in a writing period according to the logic level of the logic data. The set signal includes a first set pulse and a second set pulse having a polarity opposite to a polarity of the first set pulse. The reset signal includes a first reset pulse and a second reset pulse having a polarity opposite to a polarity of the first reset pulse.

According to an embodiment of the invention, a resistive memory apparatus includes a resistive memory cell array and a control unit. The resistive memory cell array includes a plurality of resistive memory cells. The control unit is coupled to the resistive memory cell array. The control unit is configured to receive a logic data, determine a logic level of the logic data and select a resistive memory cell from the resistive memory cells. The control unit provides a set signal to the resistive memory cell, or provides a reset signal to the resistive memory cell in a writing period according to the logic level of the logic data. The set signal includes a first set pulse and a second set pulse having a polarity opposite to a polarity of the first set pulse. The reset signal includes a first reset pulse and a second reset pulse having a polarity opposite to a polarity of the first reset pulse.

To sum up, in the exemplary embodiments of the invention, the set pulses of the set signal have opposite polarities, and the reset pulses of the reset signal have opposite polarities in the writing period. The provided writing method increases the accuracy of the state of each memory cell when the memory cells are being read.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
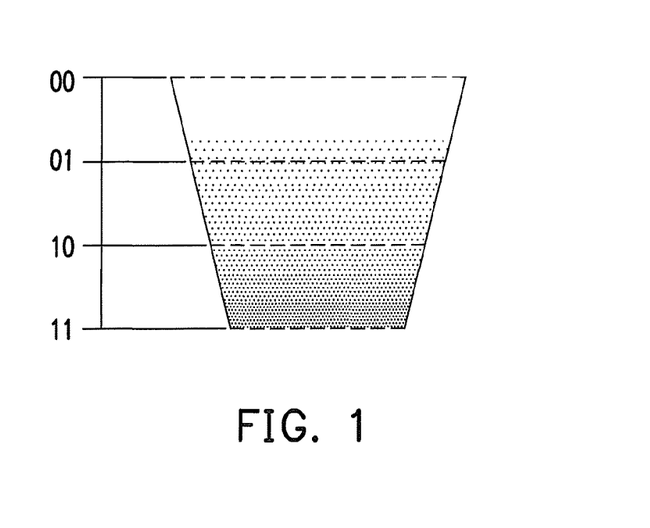
FIG. 1 is a schematic diagram illustrating energy levels of a resistive memory cell according to an embodiment of the invention.

FIG. 1 is a schematic diagram illustrating energy levels of a resistive memory cell according to an embodiment of the invention. With reference to FIG. 1, a resistive memory cell of the present embodiment is, for example, a multi-level cell (MLC). The resistive memory cell is capable of storing two or more data bits, and the term "multi-level" refers to a charge charging operation has a plurality of energy levels (i.e., a plurality of voltage levels), such that values of a plurality of bits may be stored in the resistive memory cell. As illustrated in FIG. 1, the voltage levels of the resistive memory cell in an increasing sequence correspond to data bits "11", "10", "01", and "00".

Figure 2:
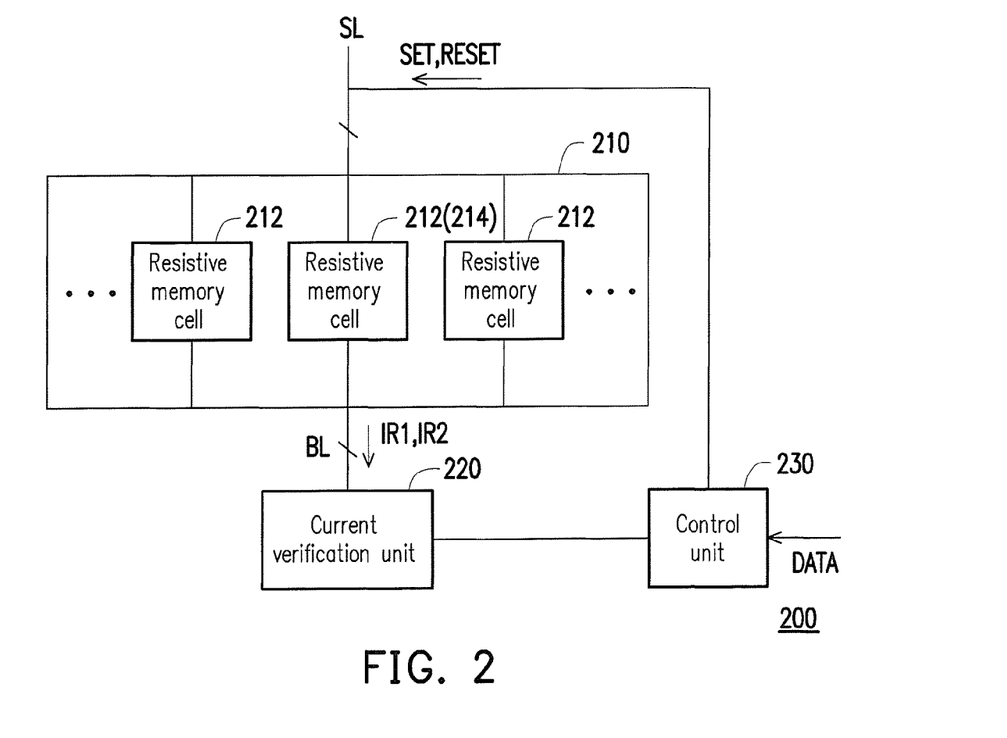
FIG. 2 is a schematic diagram illustrating a resistive memory apparatus according to an embodiment of the invention.

FIG. 2 is a schematic diagram illustrating a resistive memory apparatus according to an embodiment of the invention. With reference to FIG. 2, a resistive memory apparatus 200 of the present embodiment includes a resistive memory cell array 210, a current verification unit 220 and a control unit 230. In the present embodiment, the resistive memory cell array 210 includes a plurality of resistive memory cells 212. The resistive memory cell array 210 is coupled to the current verification unit 220 through a plurality of bit lines BL and coupled to the control unit 230 through a plurality of source lines SL. Each of the resistive memory cells 212 includes a switch element, for example, a metal oxide semiconductor field effective transistor (MOSFET) and a variable resistance element, and each of the resistive memory cells 212 provides stored data of multiple bits.

In the present embodiment, the current verification unit 220 may be any type of a current measuring element/circuit, for example, a sensing amplifier circuit. The current verification unit 220 is coupled to the resistive memory cells 212 through a plurality of bit lines BL. The current verification unit 220 is configured to verify that reading currents IR1 and IR2 generated by the resistive memory cells 212 comply with a predetermined reference current when logic data DATA is written into the resistive memory cells 212 to indicate that the control unit 230 correctly writes the logic data DATA into the resistive memory cells 212.

In the present embodiment, the control unit 230 may be, for example, a central processing unit (CPU), a microprocessor, a digital signal processor (DSP), a programmable controller, a programmable logic device (PLD) or other similar devices or a combination of the above devices. The control unit 230 is coupled to the current verification unit 220 and a plurality of the source lines SL of the resistive memory cell array 210. In the present embodiment, the control unit 230 is configured to receive the logic data DATA and determine a logic level of the logic data DATA to be written. In the present embodiment, the control unit 230 selects, for example, a resistive memory cell 214 from the resistive memory cells 212 to serve as a target memory cell for writing the logic data DATA thereinto. Thus, the control unit 230 selectively provides a set signal SET or a reset signal RESET to the resistive memory cell 214 in a writing period according to the logic level of the logic data DATA.

Figure 3:
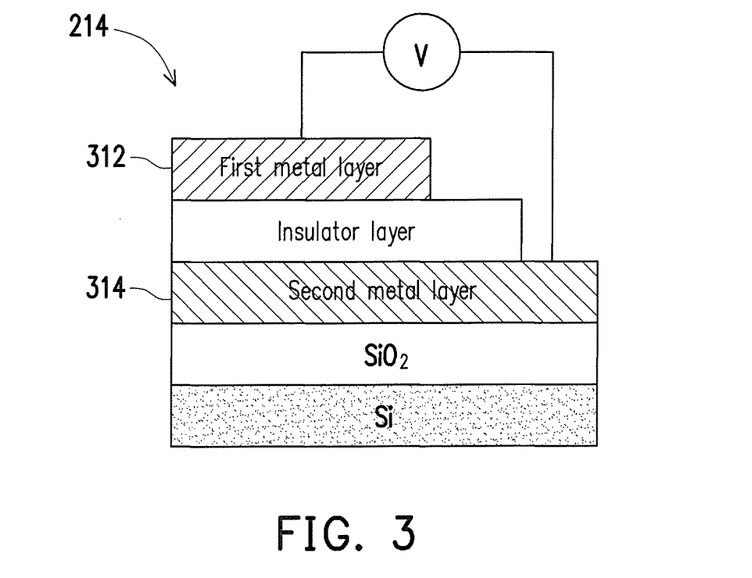
FIG. 3 is a schematic diagram illustrating an element structure of a resistive memory cell according to an embodiment of the invention.

FIG. 3 is a schematic diagram illustrating an element structure of a resistive memory cell according to an embodiment of the invention. With reference to FIG. 2 and FIG. 3, the resistive memory cell 214 of FIG. 2 has an element structure as illustrated in FIG. 3, which is a transition metal oxide (TMO) based resistive memory cell and includes a metal-insulator-metal (MIM) layer structure. The control unit 230 applies the set signal SET or the reset signal RESET to the resistive memory cell 214 through a first metal layer 312 and a second metal layer 314 which serve as an upper electrode and a lower electrode to write the logic data DATA into the resistive memory cell 214. It should be noted that the element structure of FIG. 3 is illustrated as an example for description, which is not limited in the invention. A writing method of the resistive memory apparatus of the invention may also be applicable to other resistive memory cells having the same or similar element structure.

Figure 4:
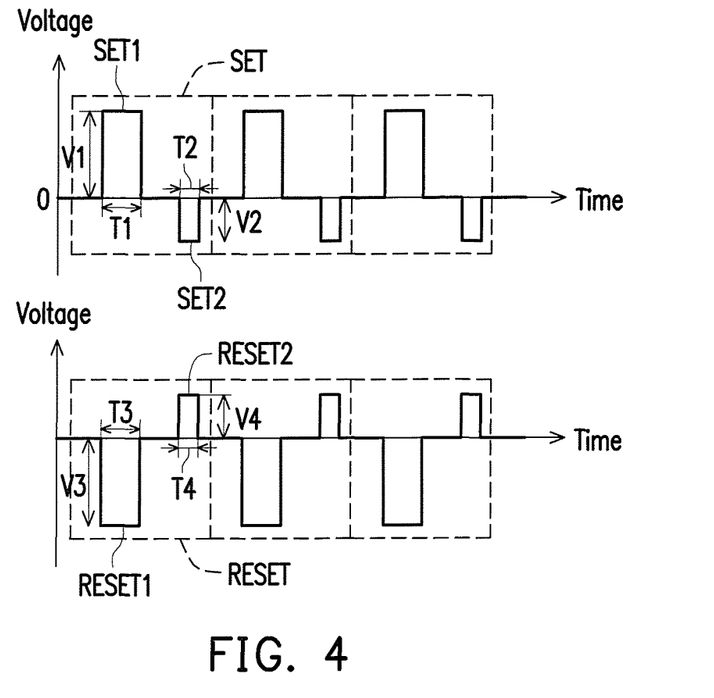
FIG. 4 is a schematic waveform diagram illustrating a set signal and a reset signal according to an embodiment of the invention.

FIG. 4 is a schematic waveform diagram illustrating a set signal and a reset signal according to an embodiment of the invention. With reference to FIG. 2 and FIG. 4, in the present embodiment, according to the logic level of the logic data DATA, the control unit 230 selects and provides a set signal SET or a reset signal RESET illustrated in FIG. 4 to the resistive memory cell 214 in the writing period. In the present embodiment, the set signal SET includes a first set pulse SET1 and a second set pulse SET2, and the reset signal RESET includes a first reset pulse RESET1 and a second reset pulse RESET2.

To be specific, in the present embodiment, from a perspective of pulse polarities, polarities of the first set pulse SET1 and the second set pulse SET2 are opposite to each other. Polarities of the first reset pulse RESET1 and the second reset pulse RESET2 are opposite to each other. The polarities of the first set pulse SET1 and the first reset pulse RESET1 are opposite to each other. The polarities of the second set pulse SET2 and the second reset pulse RESET2 are opposite to each other. In the present embodiment, the polarities of the first set pulse SET1 and the first reset pulse RESET1 are illustrated as being opposite to each other for example, but the invention is not limited thereto. In an embodiment, the first set pulse SET1 and the first reset pulse RESET1 have the same polarity.

In the present embodiment, from a perspective of pulse widths, a pulse width T1 of the first set pulse SET1 is greater than a pulse width T2 of the second set pulse SET2. In an embodiment, the pulse width T1 of the first set pulse SET1 may also be equal to the pulse width T2 of the second set pulse SET2, which is not limited in the invention. Namely, T1 is greater than or equal to T2, i.e., T1≥T2. Additionally, in the present embodiment, from a perspective of pulse amplitudes, an absolute value of a pulse amplitude V1 of the first set pulse SET1 is greater than an absolute value of a pulse amplitude V2 of the second set pulse SET2. In an embodiment, the absolute value of the pulse amplitude V1 of the first set pulse SET1 may also be equal to the absolute value of the pulse amplitude V2 of the second set pulse SET2, which is not limited in the invention. Namely, |V1| is greater than or equal to |V2|, i.e., |V1|≥|V2|. Additionally, a relationship between the pulse widths and the pulse amplitudes of the first reset pulse RESET1 and the second reset pulse RESET2 is similar to a relationship between those of the first set pulse SET1 and the second set pulse SET2. Namely, T3 is greater than or equal to T4 (T3≥T4), |V3| is greater than or equal to |V4| (|V3|≥|V4|), and thus, it will not be repeatedly described herein.

It should be noted that in the present embodiment, the pulse width T1 and the pulse amplitude V1 of the first set pulse SET1 may be equal or not equal to the pulse width T3 and the pulse amplitude V3 of the first reset pulse RESET1, which is not limited in the invention. The pulse width T2 and the pulse amplitude V2 of the second set pulse SET2 may be equal or not equal to the pulse width T4 and the pulse amplitude V4 of the second reset pulse RESET2, which is not limited in the invention.

Figure 5:
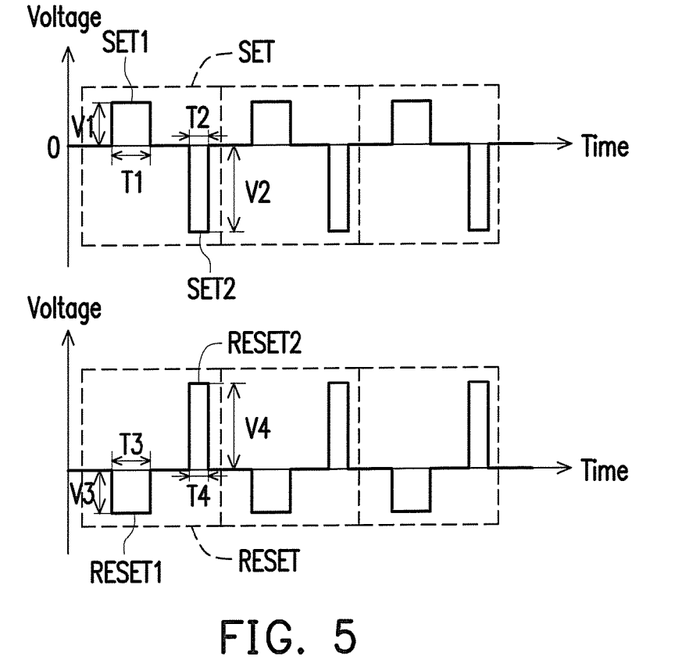
FIG. 5 is a schematic waveform diagram illustrating a set signal and a reset signal according to another embodiment of the invention.

FIG. 5 is a schematic waveform diagram illustrating a set signal and a reset signal according to another embodiment of the invention. With reference to FIG. 2 and FIG. 5, waveforms of the set signal SET and the reset signal RESET of the present embodiment are similar to those of the embodiment illustrated in FIG. 4, though the difference therebetween lies in a relationship between values of the pulse amplitudes of the set pulses and the reset pulses. To be specific, in the present embodiment, from the perspective of the pulse amplitudes, the absolute value of the pulse amplitude V1 of the first set pulse SET1 is less than the absolute value of the pulse amplitude V2 of the second set pulse SET2. In an embodiment, the absolute value of the pulse amplitude V1 of the first set pulse SET1 may also be equal to the absolute value of the pulse amplitude V2 of the second set pulse SET2, which is not limited in the invention. Namely, |V1| is less than or equal to |V2|, i.e., |V1|≤|V2|. Additionally, the relationship between the values of the pulse amplitudes of the first reset pulse RESET1 and the second reset pulse RESET2 is similar to that between the first set pulse SET1 and the second set pulse SET2, i.e., |V3| is less than or equal to |V4|, i.e., |V3|≤|V4|, and thus, it will not be repeatedly described herein.

Figure 6:
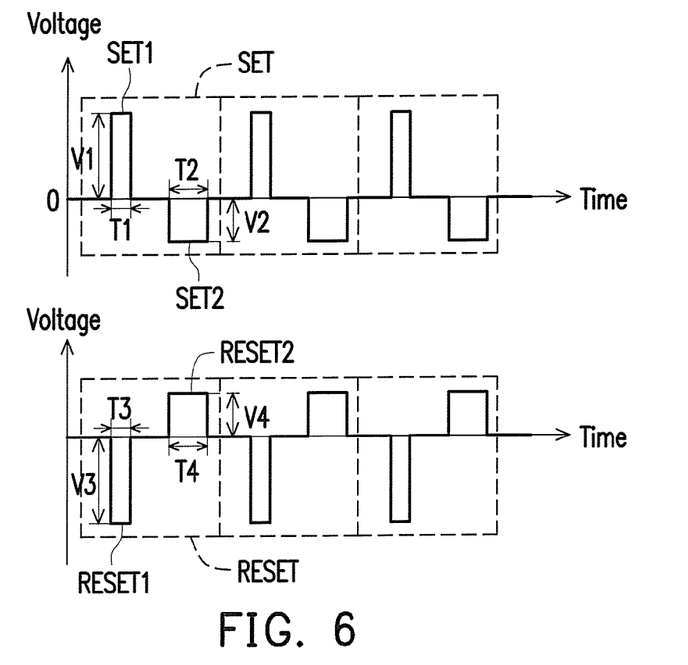
FIG. 6 is a schematic waveform diagram illustrating a set signal and a reset signal according to another embodiment of the invention.

FIG. 6 is a schematic waveform diagram illustrating a set signal and a reset signal according to another embodiment of the invention. With reference to FIG. 2 and FIG. 6, waveforms of the set signal SET and the reset signal RESET of the present embodiment are similar to those of the embodiment illustrated in FIG. 4, though the difference therebetween lies in a relationship between values of the pulse amplitudes of the set pulses and the reset pulses and a relationship between sizes of the pulse widths of the set pulses and the reset pulses. To be specific, in the present embodiment, from the perspective of the pulse widths, the pulse width T1 of the first set pulse SET1 is smaller than the pulse width T2 of the second set pulse SET2. In an embodiment, the pulse width T1 of the first set pulse SET1 may also be equal to the pulse width T2 of the second set pulse SET2, which is not limited in the invention. Namely, T1 is less than or equal to T2, i.e., T1≤T2. Additionally, the relationship between the sizes of the pulse widths of the first reset pulse RESET1 and the second reset pulse RESET2 is similar to that between the first set pulse SET1 and the second set pulse SET2, i.e., T3 is less than or equal to T4 (T3≤T4), and thus, it will not be repeatedly described herein.

Figure 7:
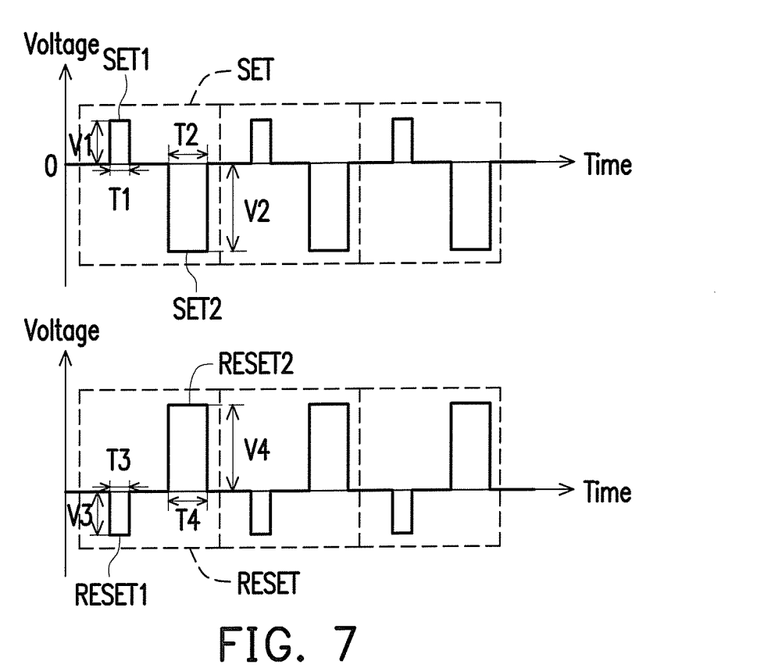
FIG. 7 is a schematic waveform diagram illustrating a set signal and a reset signal according to another embodiment of the invention.

FIG. 7 is a schematic waveform 1 diagram illustrating a set signal and a reset signal according to another embodiment of the invention. With reference to FIG. 2 and FIG. 7, waveforms of the set signal SET and the reset signal RESET are similar to those of the embodiment illustrated in FIG. 4, though the difference therebetween lies in a relationship between sizes of the pulse amplitudes of the set pulses and the reset pulses.

To be specific, in the present embodiment, from the perspective of the pulse widths, the pulse width T1 of the first set pulse SET1 is smaller than the pulse width T2 of the second set pulse SET2. In an embodiment, the pulse width T1 of the first set pulse SET1 may also be equal to the pulse width T2 of the second set pulse SET2, which is not limited in the invention. Namely, T1 is less than or equal to T2, i.e., T1≤T2. Additionally, in the present embodiment, from the perspective of the pulse amplitudes, the absolute value of the pulse amplitude V1 of the first set pulse SET1 is less than the absolute value of the pulse amplitude V2 of the second set pulse SET2. In an embodiment, the absolute value of the pulse amplitude V1 of the first set pulse SET1 may also be equal to the absolute value of the pulse amplitude V2 of the second set pulse SET2, which is not limited in the invention. Namely, |V1| is less than or equal to |V2|, i.e., |V1|≤|V2|. Additionally, the relationship between the sizes of the pulse widths and the relationship between the values of the pulse amplitudes of the first reset pulse RESET1 and the second reset pulse RESET2 are similar to those between the first set pulse SET1 and the second set pulse SET2, i.e., T3 is less than or equal to T4, |V3| is less than or equal to |V4| (|V3|≤|V4|), and thus, it will not be repeatedly described herein.

In the exemplary embodiments of the invention, the control unit 230 selectively provides the set signal SET or the reset signal RESET of one of the exemplary embodiments illustrated in FIG. 4 to FIG. 7 to the resistive memory cell 214 in the writing period according to the logic level of the logic data DATA. It should be noted that in the exemplary embodiments illustrated in FIG. 4 to FIG. 7, a plurality of set signals SET, excluding the reset signals RESET, are continuously provided to the resistive memory cell 214 during the writing period of the control unit 230 providing the set signal SET. Similarly, a plurality of reset signals RESET, excluding the set signals SET, are continuously provided to the resistive memory cell 214 during the writing period of the control unit 230 providing the reset signal RESET.

Figure 8:
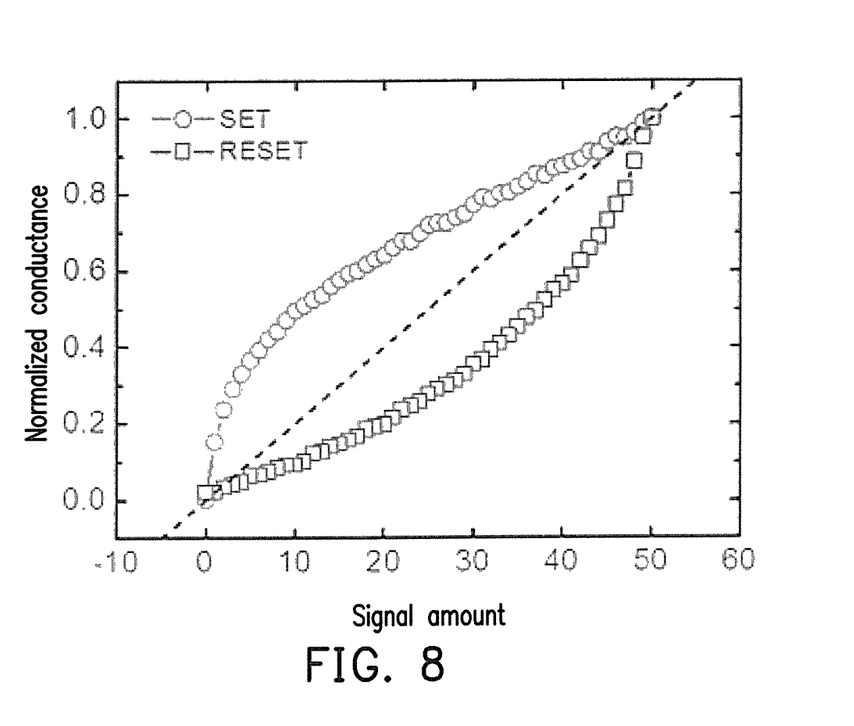
FIG. 8 is a schematic diagram illustrating the relationship between conductance of the resistive memory cells and signal amount according to an embodiment of the invention.
Figure 9:
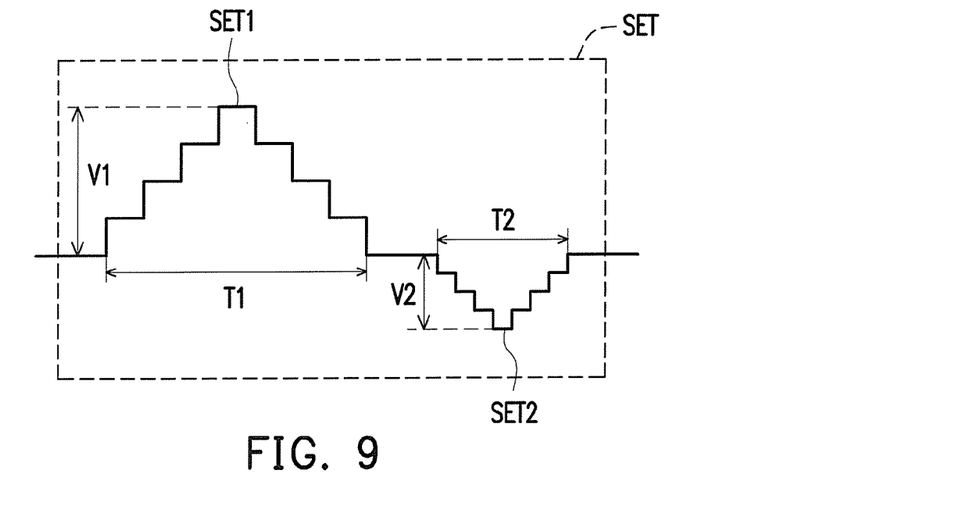
FIG. 9, FIG. 10A, FIG. 10B, FIG. 11, FIG. 12, FIG. 13A, FIG. 13B, FIG. 13C and FIG. 13D are schematic waveform diagrams illustrating the set signals of different embodiments of the invention.

FIG. 8 is a schematic diagram illustrating the relationship between a conductance and signal amount of the resistive memory cells according to an embodiment of the invention. With reference to FIG. 2 and FIG. 8, a conductance of FIG. 8 is normalized and varies with a signal amount. In the present embodiment, the control unit 230 selectively provides the set signal SET or the reset signal RESET of one of the exemplary embodiments illustrated in FIG. 4 to FIG. 7 to the resistive memory cell 214 in the writing period. In the present embodiment, as an amount of the provided set signals SET is increased, the conductance is substantially and evenly distributed within a range between the normalized conductance values 0 and 1, which indicates that the conductance is distributed in each of the intervals of the normalized conductance value corresponding to the states of the resistive memory cell 214. Similarly, as an amount of the provided reset signals RESET is increased, the conductance is also substantially and evenly distributed within a range between the normalized conductance values 0 and 1, which indicates that the conductance is distributed in each of the intervals of the normalized conductance value corresponding to the states of the resistive memory cell 214. Thus, the control unit 230 selectively provides the set signal SET or the reset signal RESET of one of the exemplary embodiments illustrated in FIG. 4 to FIG. 7 to the resistive memory cell 214 in the writing period. This writing manner increases the accuracy of determining the state of the resistive memory cell 214 when the control unit 230 is reading the resistive memory cell 214.

In the exemplary embodiments illustrated in FIG. 4 to FIG. 7, the waveforms of the set signal SET and the reset signal RESET provided by the control unit 230 in the writing period are illustrated as square waves for example, but the invention is not limited thereto. In other embodiments, the pulse waveforms of the first set pulse SET1, the second set pulse SET2, the first reset pulse RESET1 and the second reset pulse RESET1 may be step waveforms, triangular waveforms, trapezoid waveforms, semicircular waveforms, waveforms with gradually-changed slopes, or the like, which is not limited in the invention.

Figure 10A:
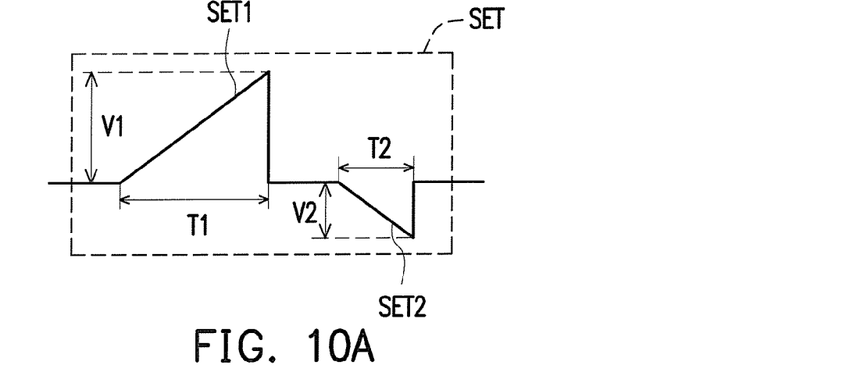
Figure 10B:
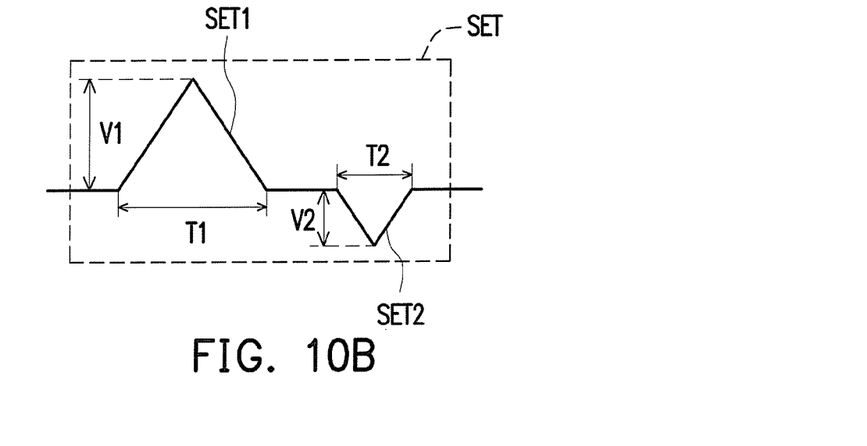
Figure 11:
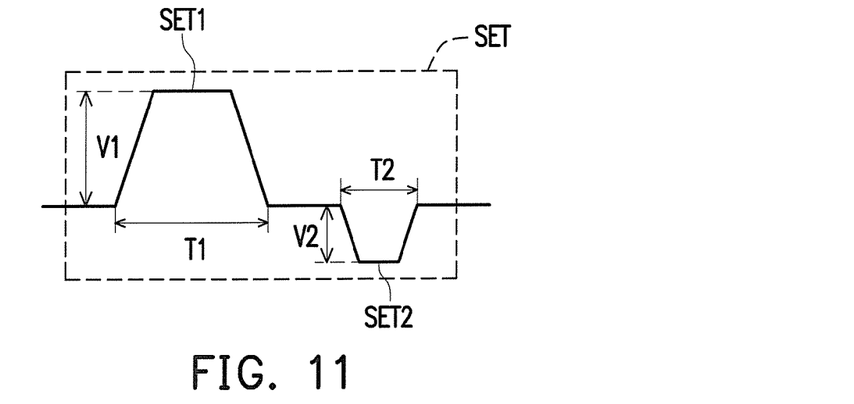
Figure 12:
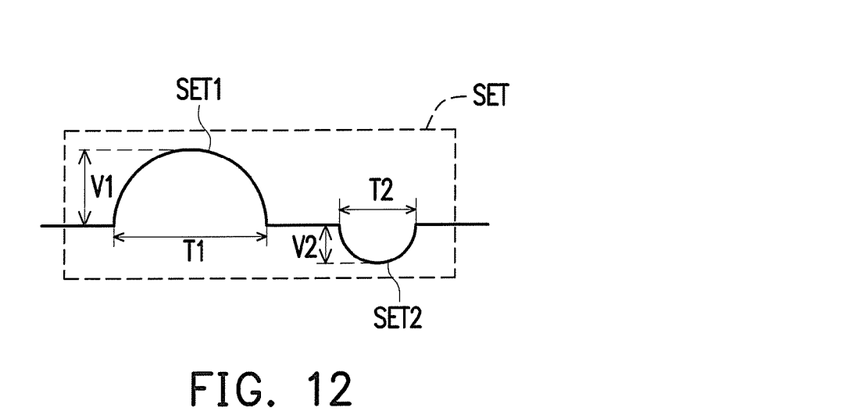
Figure 13A:
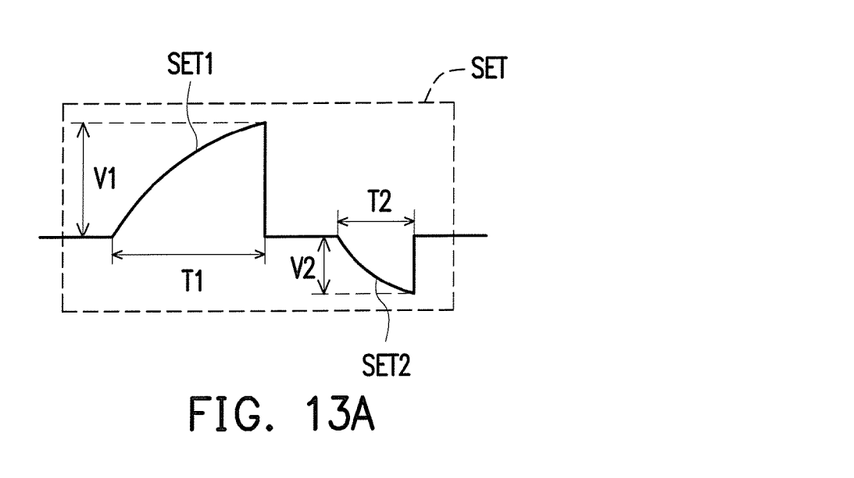
Figure 13B:
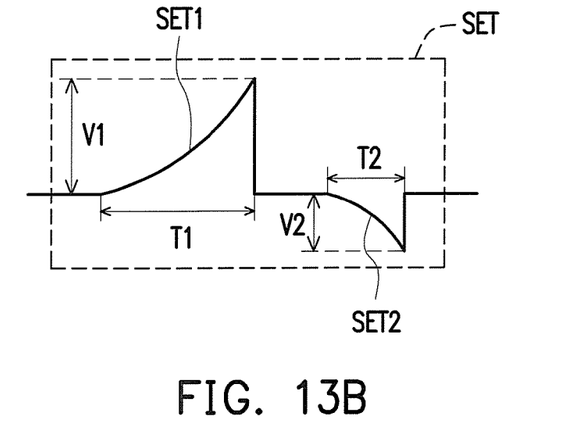
Figure 13C:
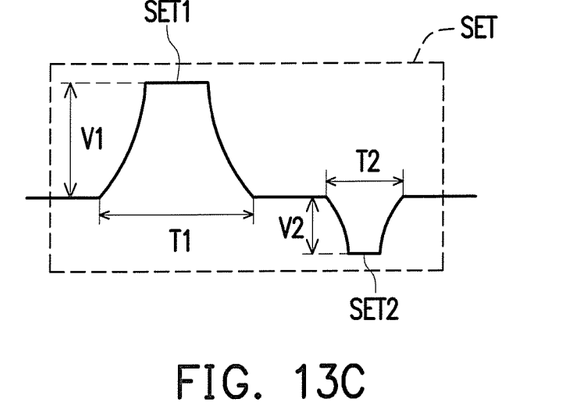
Figure 13D:
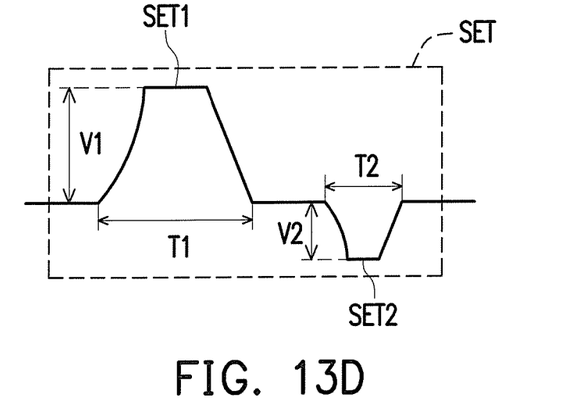

FIG. 9, FIG. 10A, FIG. 10B, FIG. 11, FIG. 12, FIG. 13A, FIG. 13B, FIG. 13C and FIG. 13D are schematic waveform diagrams illustrating the set signals of different embodiments of the invention. With reference to FIG. 9 to FIG. 13D, in FIG. 9, the pulse waveforms of the first set pulse SET1 and the second set pulse SET2 are, for example, step waveforms. In FIG. 10A and FIG. 10B, the pulse waveforms of the first set pulse SET1 and the second set pulse SET2 are, for example, different triangular waveforms. In FIG. 11, the pulse waveforms of the first set pulse SET1 and the second set pulse SET2 are, for example, trapezoid waveforms. In FIG. 12, the pulse waveforms of the first set pulse SET1 and the second set pulse SET2 are, for example, semicircular waveforms. In FIG. 13A to FIG. 13D, the pulse waveforms of the first set pulse SET1 and the second set pulse SET2 are, for example, different waveforms with gradually changed slopes. In the waveforms with gradually changed slopes, a slope of at least one signal edge of the waveforms is changed gradually. Additionally, even though FIG. 9 to FIG. 13D only illustrate exemplary embodiments of the set signals having different pulse waveforms for description, different pulse waveforms of the reset signals may also be deduced according to the embodiments illustrated in FIG. 9 to FIG. 13D and thus, it will not be repeatedly described herein.

Figure 14:
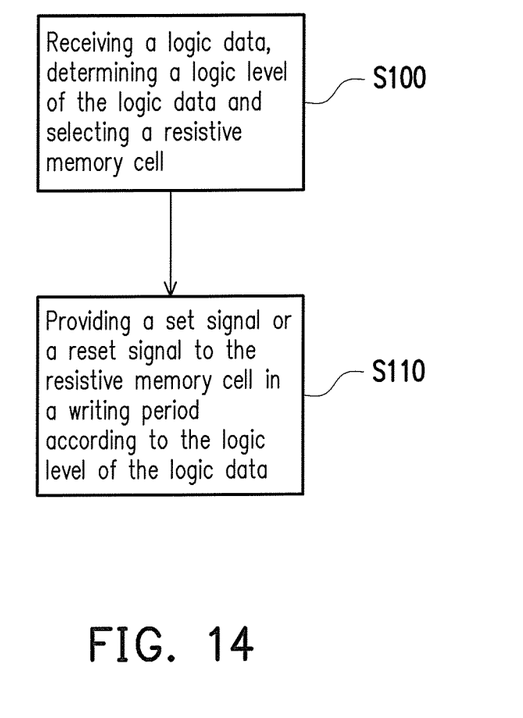
FIG. 14 is a flowchart illustrating a writing method of a resistive memory apparatus according to an embodiment of the invention.

FIG. 14 is a flowchart illustrating a writing method of a resistive memory apparatus according to an embodiment of the invention. With reference to FIG. 2 and FIG. 14, the writing method of the present embodiment is applicable to at least the resistive memory apparatus 200 illustrated in FIG. 2. In step S100, the control unit 230 receives the logic data DATA, determines the logic level of the logic data DATA and selects the resistive memory cell 214. In step S110, according to the logic level of the logic data DATA, the control unit 230 provides the set signal SET or the reset signal RESET to the resistive memory cell 214 in the writing period. In the present embodiment, the set signal SET includes the first set pulse SET1 and the second set pulse SET2 whose polarity is opposite to that of the first set pulse SET1. The reset signal RESET includes the first reset pulse RESET1 and the second reset pulse RESET2 whose polarity is opposite to that of the first reset pulse RESET1.

Moreover, the writing method of the resistive memory apparatus described in this embodiment of the invention is sufficiently taught, suggested, and embodied in the embodiments illustrated in FIG. 1 to FIG. 12D, and therefore no further description is provided herein.

To summarize, in the exemplary embodiments of the invention, the control unit provides the set signal or the reset signal to the resistive memory cells in the writing period according to the logic level of the logic data. The set signal includes a plurality of set pulses, and the reset signal includes a plurality of reset pulse. The polarities of the set pulses in the set signal are opposite to each other, and the polarities of the reset pulses in the reset signal are opposite to each other. The provided writing method may increase the accuracy of determining the states of the memory cells when the memory cells are being read.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A writing method of a resistive memory apparatus, comprising:
   receiving a logic data, determining a logic level of the logic data and selecting a resistive memory cell; and
   providing a set signal to the resistive memory cell, or providing a reset signal to the resistive memory cell in a writing period according to the logic level of the logic data,
   wherein the set signal comprises a first set pulse and a second set pulse having a polarity opposite to a polarity of the first set pulse, the reset signal comprises a first reset pulse and a second reset pulse having a polarity opposite to a polarity of the first reset pulse, and the first set pulse, the second set pulse, the first reset pulse, and the second reset pulse are configured to be applied to place the selected resistive memory cell in a desired state,
   wherein an absolute value of a pulse amplitude of the first set pulse is less than an absolute value of a pulse amplitude of the second set pulse, and an absolute value of a pulse amplitude of the first reset pulse is less than an absolute value of a pulse amplitude of the second reset pulse.

2. The writing method of the resistive memory apparatus according to claim 1, wherein a pulse width of the first set pulse is greater than or equal to a pulse width of the second set pulse, and a pulse width of the first reset pulse is greater than or equal to a pulse width of the second reset pulse.

3. The writing method of the resistive memory apparatus according to claim 1, wherein a pulse width of the first set pulse is smaller than a pulse width of the second set pulse, and a pulse width of the first reset pulse is smaller than a pulse width of the second reset pulse.

4. A resistive memory apparatus, comprising:
   a resistive memory cell array, comprising a plurality of resistive memory cells; and
   a control unit, coupled to the resistive memory cell array and configured to receive a logic data, determine a logic level of the logic data, select a resistive memory cell from the resistive memory cells, and the control unit providing a set signal to the resistive memory cell, or providing a reset signal to the resistive memory cell in a writing period according to the logic level of the logic data,
   wherein the set signal comprises a first set pulse and a second set pulse having a polarity opposite to a polarity of the first set pulse, the reset signal comprises a first reset pulse and a second reset pulse having a polarity opposite to a polarity of the first reset pulse, and the first set pulse, the second set pulse, the first reset pulse, and the second reset pulse are configured to be applied to place the selected resistive memory cell in a desired state,
   wherein an absolute value of a pulse amplitude of the first set pulse is less than an absolute value of a pulse amplitude of the second set pulse, and an absolute value of a pulse amplitude of the first reset pulse is less than an absolute value of a pulse amplitude of the second reset pulse.

5. The resistive memory apparatus according to claim 4 wherein a pulse width of the first set pulse is greater than or equal to a pulse width of the second set pulse, and a pulse width of the first reset pulse is greater than or equal to a pulse width of the second reset pulse.

6. The resistive memory apparatus according to claim 4, wherein a pulse width of the first set pulse is smaller than a pulse width of the second set pulse, and a pulse width of the first reset pulse is smaller than a pulse width of the second reset pulse.

* * * * *